United States Patent [19]
Hokazono

[11] Patent Number: 5,619,794
[45] Date of Patent: Apr. 15, 1997

[54] COMPLEX STRUCTURE MOLDING PROCESS AND APPARATUS

[75] Inventor: Keizo Hokazono, Iwakuni, Japan

[73] Assignee: Teijin Seiki Co., Ltd., Osaka, Japan

[21] Appl. No.: 405,946

[22] Filed: Mar. 17, 1995

[30] Foreign Application Priority Data

Mar. 17, 1994 [JP] Japan ..................... 6-046287

[51] Int. Cl.⁶ ............ H01R 43/20; H01L 21/56; H01L 23/48
[52] U.S. Cl. ............ 29/883; 29/564.6; 29/566.2; 29/566.3; 29/827; 29/884; 264/272.14; 264/272.17
[58] Field of Search ............... 29/564.6, 566.1, 29/566.2, 566.3, 827, 856, 858, 883, 884; 264/272.14, 272.17

[56] References Cited

U.S. PATENT DOCUMENTS

| | | | |
|---|---|---|---|
| 4,417,396 | 11/1983 | Ammon et al. | 29/884 |
| 4,602,429 | 7/1986 | Nicoll | 29/884 |
| 4,667,397 | 5/1987 | Day et al. | 29/566.3 X |
| 5,148,596 | 9/1992 | Zahn | 29/564.6 X |

FOREIGN PATENT DOCUMENTS

| | | | |
|---|---|---|---|
| 190339 | 11/1982 | Japan | 29/827 |
| 154369 | 7/1991 | Japan | 29/827 |
| 63440 | 2/1992 | Japan | 29/883 |
| 109796 | 4/1993 | Japan | 29/883 |

*Primary Examiner*—Peter Vo
*Attorney, Agent, or Firm*—Lane, Aitken & McCann

[57] ABSTRACT

A complex structure molding process for molding a complex structure including a plastic base and a plurality of terminal pins, comprising the steps of molding the plastic base to have the terminal pins partly embedded in the plastic base, storing a continuous metal material having a rim portion and a plurality of terminal pins perpendicularly extending from the rim portion, cutting the continuous metal material in a first direction parallel to the direction in which the terminal pins extend from the rim portion to form a segmented metal material, and setting the segmented metal material in the molding means in the state having the segmented metal material assume their predetermined attitudes. The continuous metal material is fed in a second direction perpendicular to the first direction to cut the continuous metal material and to set the segmented metal material for molding the plastic base to have the terminal pins partly embedded in the plastic base. The molded segmented metal material is cut in the second direction to remove the rim portion from the terminal pins and the plastic base.

16 Claims, 5 Drawing Sheets

COMPLEX STRUCTURE MOLDING PROCESS AND APPARATUS

FIELD OF THE INVENTION

The present invention relates to a complex structure molding process of and apparatus for molding a complex structure which can for example be used in electrical components or parts to be assembled in computers and other electric appliances.

DESCRIPTION OF THE PRIOR ART

Such a complex structure comprises a plastic base and a plurality of terminal pins each having an inner portion embedded in said plastic base and an outer portion extending outwardly of the plastic base. The terminal pins are usually projected outwardly from the plastic base and arranged on the plastic base in equal spaced relationship with one another. The purpose of using the complex structure in the computers and other electric appliances is not only to reduce the size of a final product but also to lessen the manufacturing cost per the product. In the process of manufacturing the computers and other electric appliances, the complex structure is successively and automatically produced by a complex structure producing machine which comprises a plastic extruder for extruding a plastic material, a material loader for loading an insert material onto a metal mold structure to be combined with the plastic material extruded by the extruder in the metal mold structure, an unloader for unloading a molded product, i.e., complex structure produced in the metal mold structure, and a feeder for feeding the metal material and the complex structure.

In the conventional complex structure producing process, a lengthy ribbon-like metal material is employed and processed continuously from an initial step at which the metal material is unwound from a metal material winding reel to a final step at which the continuous metal material is cut and trimmed to a predetermined length to produce the final complex structure. The continuous processing operation of the lengthy ribbon-like metal material results in the fact that the metal material is required to partly be cut in the longitudinal direction of the metal material and to be formed with a plurality of bores equally spaced in the longitudinal direction of the metal material between the initial step and the final step in order for each of the bores to allow the metal mold structure to easily perform its motion when being closed and opened before the molten plastic material is filled into the metal mold structure. The perforation of the continuous metal material requires part of the material to be scrapped, thereby enhancing production cost for the final complex structure.

It is, therefore, an object of the present invention to provide a complex structure molding process of and apparatus for molding a complex structure without any bores perforated in the continuous metal material.

It is another object of the present invention to provide a complex structure molding process and apparatus which can reduce the production cost of the final complex structure.

SUMMARY OF THE INVENTION

According to one aspect of the present invention there is provided a complex structure molding process for molding a complex structure including a plastic base and a plurality of terminal pins having an inner portion embedded in the plastic base and an outer portion extending outwardly of the plastic base, comprising the steps of: molding the plastic base to have the terminal pins partly embedded in the plastic base; storing a continuous metal material having a rim portion and a plurality of terminal pins perpendicularly extending from the rim portion and equally spaced apart from one another along the longitudinal direction of the rim portion; cutting the continuous metal material in a first direction parallel to the direction in which the terminal pins extend from the rim portion to form a plurality of segmented metal materials before the segmented metal materials are fed to the molding means to partly be molded with the plastic; setting the segmented metal materials in the molding means in the state having the segmented metal material assume their predetermined attitudes; feeding the continuous metal material to cut the continuous metal materials and to set the segmented metal materials for molding the plastic base to have the terminal pins partly embedded in the plastic base; and cutting the molded segmented metal materials in a second direction perpendicular to the first direction to remove the rim portion from the terminal pins and the plastic base.

According to another aspect of the present invention there is provided a complex structure molding process for molding a complex structure including a plastic base and a plurality of terminal pins having a pair of inner portions each embedded in the plastic base and a pair of outer portions each extending outwardly of the plastic base, comprising the steps of: molding the plastic base to have the terminal pins partly embedded in the plastic base; storing a pair of continuous metal material arranged in face-to-face relationship with each other and each having a rim portion and a plurality of terminal pins perpendicularly extending from the rim portion and equally spaced apart from one another along the longitudinal direction of the rim portion; cutting the continuous metal materials in a first direction parallel to the direction in which the terminal pins respectively extend from the rim portions to form pairs of segmented metal materials before the segmented metal materials are fed to the molding means to partly be molded with the plastic; setting the segmented metal materials in the molding means in the state having the segmented metal material assume their predetermined attitudes; feeding the continuous metal materials to cut the continuous metal materials and to set the segmented metal materials for molding the plastic base to have the terminal pins partly embedded in the plastic base; and cutting the molded segmented metal materials in a second direction perpendicular to the first direction to remove the rim portions from the terminal pins and the plastic base.

According to a further aspect of the present invention there is provided a complex structure molding apparatus for molding a complex structure including a plastic base and a plurality of terminal pins having an inner portion embedded in the plastic base and an outer portion extending outwardly of the plastic base, comprising: molding means for molding the plastic base to have the terminal pins partly embedded in the plastic base; metal material storing means for storing a continuous metal material having a rim portion and a plurality of terminal pins perpendicularly extending from the rim portion and equally spaced apart from one another along the longitudinal direction of the rim portion; first metal material cutting means for cutting the continuous metal material in a first direction parallel to the direction in which the terminal pins extend from the rim portion to form a plurality of segmented metal materials which are to be fed to the molding means to partly be molded with the plastic; metal material setting means for setting the segmented metal material in the molding means in the state having the segmented metal material assume their predetermined attitudes; metal material feeding means for feeding the metal material to the material cutting means and the metal material setting means from the material storing means; and second material cutting means for cutting the molded segmented metal materials in a second direction perpendicular to the first direction to remove the rim portion from the terminal pins and the plastic base.

According to a yet further aspect of the present invention there is provided a complex structure molding apparatus for molding a complex structure including a plastic base and a plurality of terminal pins having a pair of inner portions each embedded in the plastic base and a pair of outer portions each extending outwardly of the plastic base, comprising: molding means for molding the plastic base to have the terminal pins partly embedded in the plastic base; metal material storing means for storing a pair of continuous metal materials arranged in face-to-face relationship with each other and each having a rim portion and a plurality of terminal pins perpendicularly extending from the rim portion and equally spaced apart from one another along the longitudinal direction of the rim portion; first metal material cutting means for cutting the continuous metal materials in a first direction parallel to the direction in which the terminal pins respectively extend from the rim portions to form pairs of segmented metal materials which are to be fed to the molding means to partly be molded with the plastic; metal material setting means for setting the segmented metal materials in the molding means in the state having the segmented metal material assume their predetermined attitudes; metal material feeding means for feeding the metal materials to the material cutting means and the metal material setting means from the material storing means; and second material cutting means for cutting the molded segmented metal materials in a second direction perpendicular to the first direction to remove the rim portions from the terminal pins and the plastic base.

BRIEF DESCRIPTION OF THE DRAWINGS

The features and advantages of the present invention will be more clearly understood from the following description taken in conjunction with the accompanying drawings in which.

DESCRIPTION OF THE PREFERRED EMBODIMENTS

One embodiment of the complex structure molding apparatus according to the present invention will be described hereinlater with reference to the accompanying drawings.

Figure 1:
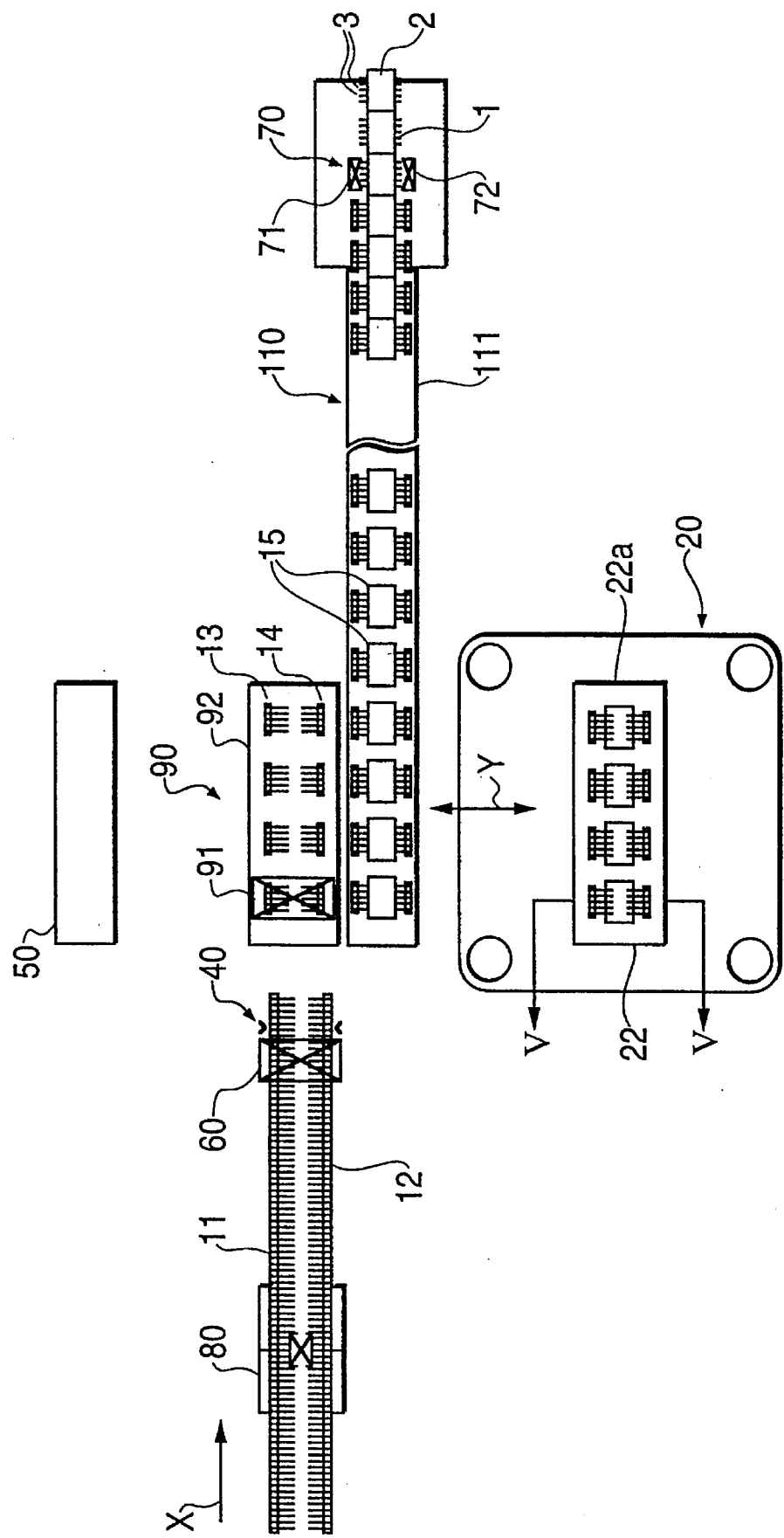
FIG. 1 is a schematic plan view of one embodiment of the complex structure molding apparatus according to the present invention.

The complex structure molding apparatus molding is directed to produce a complex structure 1 which is shown in FIG. 1 as including a plastic base 2 and a plurality of terminal pins 3 each having an inner portion embedded in the plastic base 3 and an outer portion extending outwardly of the plastic base 2. The plastic base 2 of the complex structure 1 is formed with a plurality of connective holes not shown in the drawing. The complex structure 1 forms a connecter member including the terminal pins and a plastic connecter body having a set of connective holes respectively receive a set of terminal pins of an electric component and spaced apart from one another in the directions shown by arrows X and Y in FIG. 1.

Figure 2:
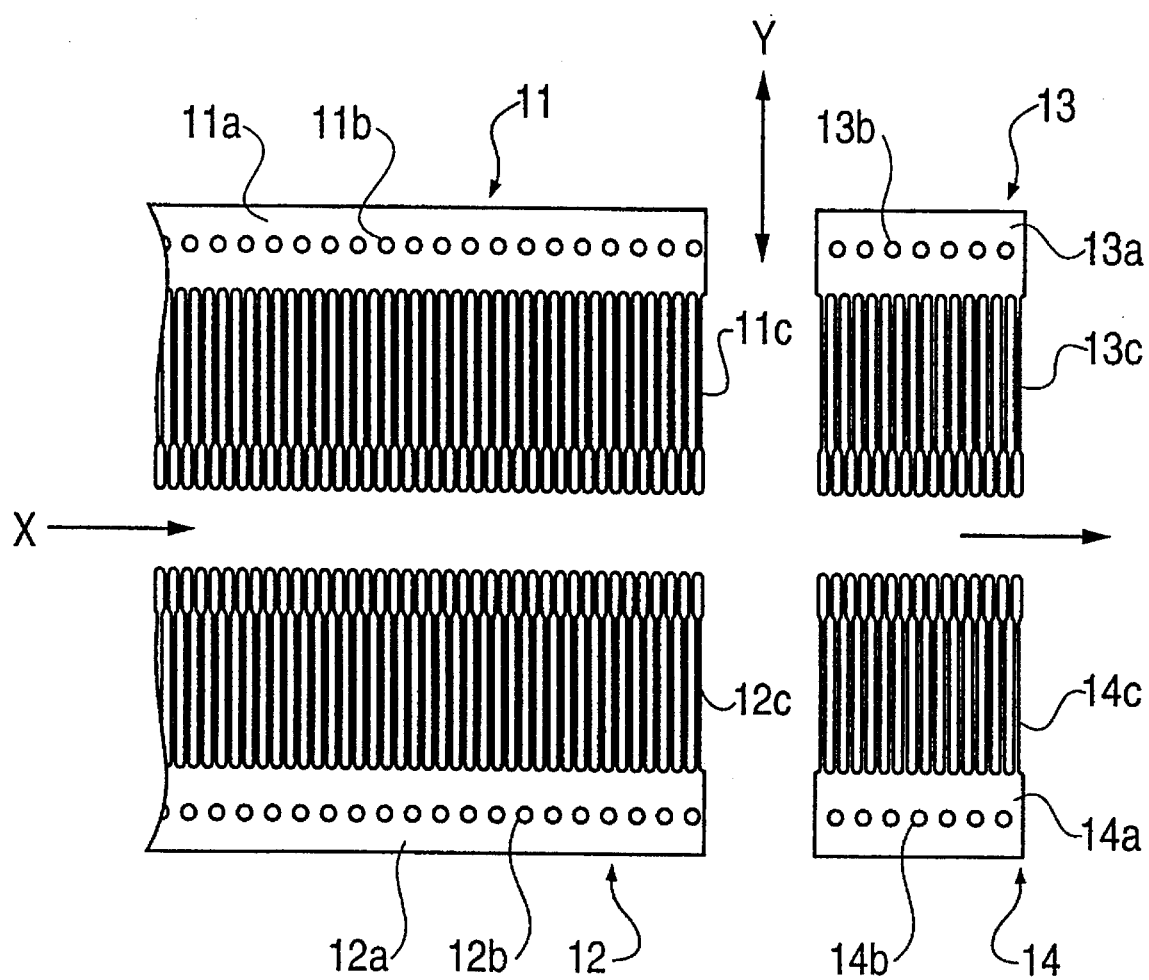
FIG. 2 is a fragmentary plan view of a pair of continuous metal materials and a pair of segmented metal materials segmented from the continuous metal materials to be fed to molding apparatus according to the present invention.
Figure 3:
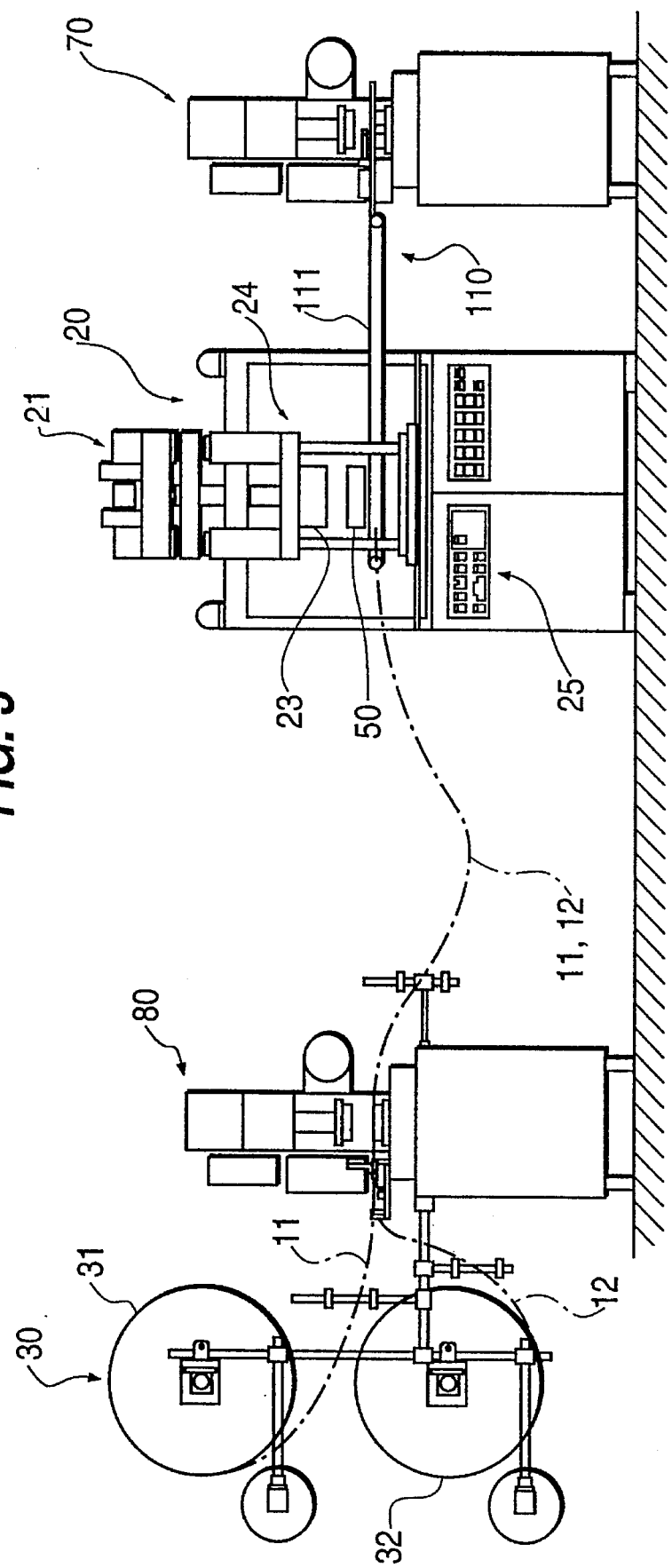
FIG. 3 is an elevational view of the complex structure molding apparatus according to the present invention.
Figure 4:
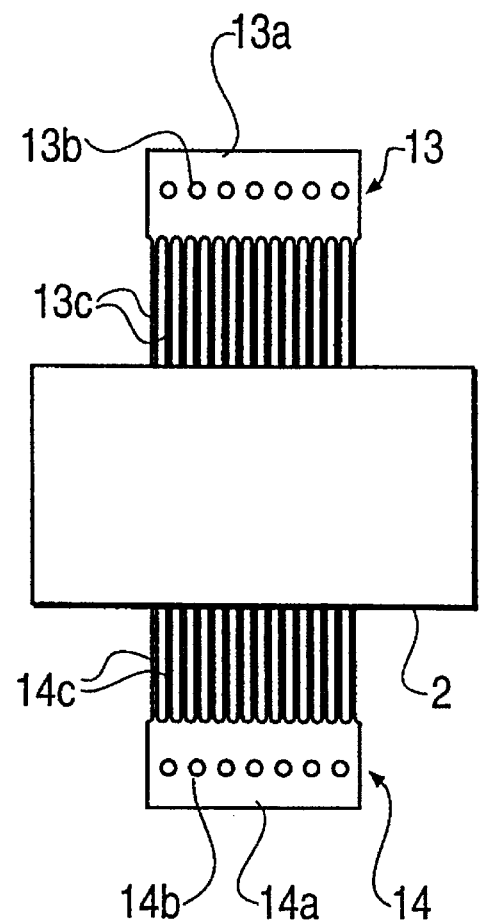
FIG. 4 is a plan view of a molded composite including a plastic base of the complex structure molded by the complex structure molding apparatus according to the present invention and the segmented metal materials partly embedded in the plastic base.

According to the present invention, the complex structures 1 are intermittently processed by a pair of continuous metal materials 11 and 12 which are specifically shown in FIG. 2 as arranged in face-to-face relationship with each other and each comprising a rim portion 11a and 12a formed with a plurality of holes 11b and 12b equally spaced apart from one another in its longitudinal direction shown by an arrow X and a plurality, of pin portions 11c and 12c perpendicularly extending from the rim portion 11a and 12a in a direction shown by an arrow Y. The free end portions of the pin portions 11c and 12c are plated with an electricity conductive material such as gold so that the pin portions 11c and 12c can be connected with electrical components to be assembled into an electric device.

The complex structure molding apparatus is shown in FIGS. 1 to 4 as comprising molding means 20 for molding the plastic base 2 of the complex structure 1 to have the terminal pins 3 partly embedded in the plastic base 2, metal material storing means 30 for storing the continuous metal materials 11 and 12, first metal material cutting means 40 for cutting the continuous metal materials 11 and 12 in a first direction parallel to the direction Y in which the pin portions 11c and 12c extend from the continuous rim portion 11a and 12a to form a plurality of segmented metal materials 13 and 14 which are to be fed to the molding means 20 to be partly molded with the plastic and respectively have segmented rim portions 13a and 14a, metal material setting means 50 for setting the segmented metal material 13 and 14 in the molding means 20 in the state having the segmented metal material 13 and 14 assume their predetermined attitudes, metal material feeding means 60 for feeding the continuous metal material 11 and 12 to the first material cutting means 40 and the metal material setting means 50 from the material storing means 30, and second material cutting means 70 for cutting the molded segmented metal materials 13 and 14 in a second direction perpendicular to the first direction y to remove the rim portion 13a and 14a from the pin members 13c and 14c and the plastic base 2.

The molding means 20 of the complex structure molding apparatus according to the present invention comprises an extruder 21 for extruding a plastic material, a metal mold structure including a stationary metal mold 22 formed with a plurality of cavities 22a held in communication with the extruder 21, a movable metal mold 23 movable to and from the stationary metal mold 22 to open and close the cavities 22a, and a clamping mechanism 24 for clamping the movable metal mold 23 with respect to the stationary metal mold 22 before each of the cavities 22a are filled with the molten plastic material by the extruder 21 under the state that the segmented metal materials 13 and 14 are partly placed in the cavities 22a of the stationary metal mold 22.

The metal storing means 30 is constituted by a pair of reels 31 and 32 each having the continuous metal material 11 or 12 wound thereon to unwind the continuous metal materials 11 and 12 under the state that the continuous metal materials 11 and 12 are arranged in face-to-face relationship with each other as shown in FIG. 2.

Figure 5:
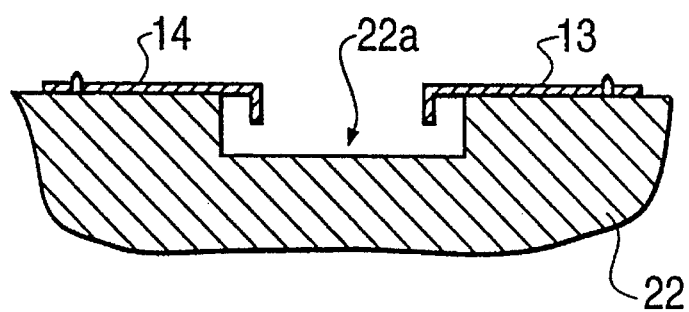
FIG. 5 is a cross-sectional view taken along the line V—V in FIG. 1.

The complex structure molding apparatus further comprises metal pressing means 80 for performing the step of upwardly or downwardly bending the opposing inner end portions of the metal materials 11 and 12 to form a pair of half-processed continuous metal materials each in the form of L-shape as shown in FIG. 5.

Figure 6:
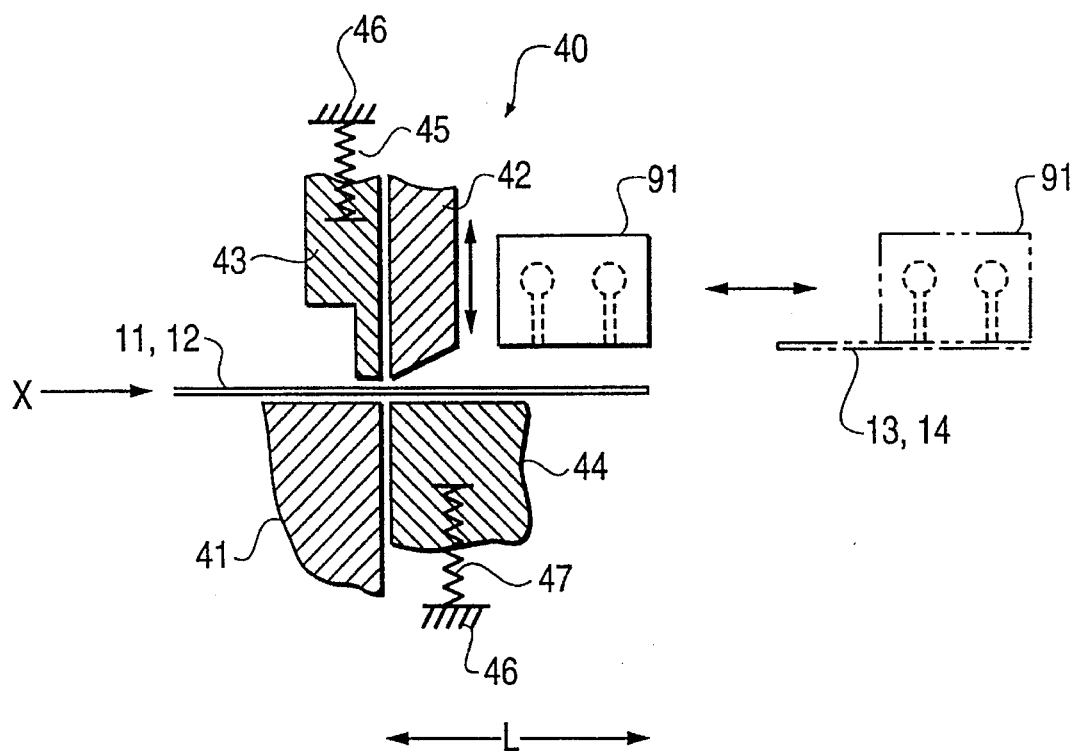
FIG. 6 is a fragmentary cross-sectional view showing first metal material cutting means and metal material arranging means forming part of the complex structure molding apparatus according to the present invention.
Figure 7:
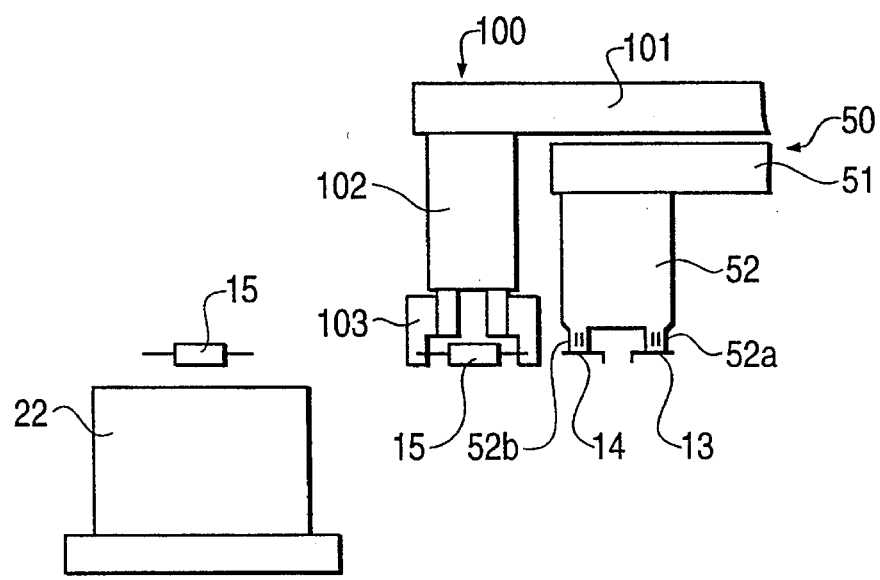
FIG. 7 is a schematic side elevational view of a metal mold and metal material setting means forming part of the complex structure molding apparatus according to the present invention.

The first metal material cutting means 40 is constituted by a cutting mechanism which is best shown in FIG. 6 as comprising a stationary cutter blade 41, a movable cutter blade 42 movable toward and away from a cutting position where the stationary cutter blade 41 and movable cutter blade 42 cooperate with each other to simultaneously cut the continuous metal materials 11 and 12 like an ordinary known cutter. The stationary cutter blade 41 and the movable cutter blade 42 are adapted to extend in the first direction so that the upward and downward movement of the movable cutter blade 42 with respect to the stationary cutter blade 41 causes the continuous metal material 11 and 12 to be cut into a plurality of segmented metal materials 13 and 14 which are to be fed to the molding means 20. The cutting mechanism further comprises a first movable clamp 43 positioned above the stationary cutter blade 41 and movable toward away from a clamping position where the continuous metal materials 11 and 12 are clamped in cooperation with the stationary cutter blade 41, and a second movable clamp 44 positioned below the movable cutter blade 42 and movable toward away from a clamping position where the continuous metal materials 11 and 12 are clamped in cooperation with the movable cutter blade 42. When the first and second movable clamps 43 and 44 are moved to the respective clamping positions, the continuous metal materials 11 and 12 are cut by the stationary cutter blade 41 and the movable cutter blade 42 into the segmented metal materials 13 and 14. The first movable clamp 43 is resiliently urged by first resilient means constituted by a first helical coil spring 45 secured to a stationary member 46 forming part of the molding means 20, while the second movable clamp 44 is resiliently urged by second resilient means constituted by a second helical coil spring 47 secured to the stationary member 46.

The complex structure molding apparatus further comprises metal material arranging means 90 which is constituted by a vacuum chuck 91 adapted to retain and release the segmented metal materials 13 and 14 and a flat table 92 on which the segmented metal materials are arranged. The vacuum chuck 91 is movable in the second direction between a first position where the segmented metal materials 13 and 14 are received from the first metal material cutting means 40 and a second position where the segmented metal materials 13 and 14 are fed to the metal material setting means 50. The movement of the vacuum chuck 91 is performed by transferring means not shown in the drawings but designed to be controlled by a servo-motor to have the segmented metal materials arranged in equally spaced relationship with one another. The servo-motor is operative to have the distance between the adjacent two segmented metal materials varied in response to various molding conditions including the size of the metal mold structure and the kinds of the final product of the complex structure 1. The motion of the vacuum chucks are carried out by a suitable reciprocating mechanism well known in the art.

The metal material setting means 50 is adapted to set the segmented metal materials 13 and 14 in the molding means 20 under the state that the segmented metal materials 13 and 14 are held in spaced relationship with one another in the second direction. The metal material setting means 50 comprises a robot arm 51 and a vacuum chuck 52 having a pair of suction nozzle portions 52a and 52b capable of catching the segmented metal materials 13 and 14. The robot arm 51 and the vacuum chuck 52 are movable between a first position where the segmented metal materials 13 and 14 are received from the metal material arranging means 90 and a second position where the segmented metal materials 13 and 14 are furnished to the stationary metal mold 22. The motions of the robot arm 51 and the vacuum chuck 52 are carried out by a suitable reciprocating mechanism well known in the art.

The metal material feeding means 60 is constituted by a feeder adapted to intermittently feed the continuous metal materials 13 and 14 to the first metal material cutting means 40. The feeding direction is perpendicular to the first direction of the continuous metal materials 11 and 12. The feeding stroke is designed to be varied by a servo-motor depending upon the kinds of the final product of the complex structure 1. The servo-motor is assembled in the feeder in a known manner.

The complex structure molding apparatus further comprises molded composite removing means 100 for removing from the metal mold structure 22 and 23 a plurality of molded composites 15 each constituted by the plastic base 2 and the segmented metal materials 13 and 14 partly embedded in the plastic base 2. The molded composite removing means 100 comprises a robot arm 101 and a mechanical chuck unit 102 having a plurality of chuck portions 103 capable of concurrently catching the molded composites 15 on the metal mold structure 22 and 23. The mechanical chuck unit 102 of the molded composite removing means 100 is movable between a first position where the molded composites 15 are caught and removed from the stationary metal mold 22 of the molding means 20 and a second position where the molded composites 15 are released from the chuck portions 103 of the mechanical chuck unit 102. The motions of the robot arm 101 and the mechanical chuck unit 102 are carried out by a suitable reciprocating mechanism well known in the art and thus not shown in the drawings.

The second material cutting means 70 of the complex structure molding apparatus is shown in FIG. 1 as being constituted by a pair of cutter units 71 and 72 which are arranged in opposing and spaced relationship with each other in the first direction across the central line of the conveyor 110 so that the rim portions 13a and 14a of the segmented metal materials 13 and 14 are removed from the inner ens portions of the pin portions 13c and 14c and the plastic base 2 to form the final complex structure 1. The cutter units 71 and 72 are constructed in a well known fashion and controlled by the controlling means which will be hereinlater described.

The reference number 110 designates molded composites transferring means 110 for transferring the molded composites 15 to the second material cutting means 70 after the molded composites 15 are released from the mechanical chuck unit 102 of the molded composite removing means 100. The molded composite transferring means 110 comprises a belt conveyer 111 extending in the second direction and different in position in the first direction to be between the stationary metal mold 22 and the continuous metal materials 11 and 12.

The complex structure molding means further comprises controlling means for controlling the operational conditions of the molding means 20, the metal material storing means 30, the first metal material cutting means 40, the metal material setting means 50, the metal material feeding means 60 and the second metal material cutting means 70. The controlling means is associated with memorizing means for memorizing data indicative of the number of terminal pins 3 in the complex structure 1 and the lengths L of the segmented metal materials 13 and 14 in the second direction in accordance with the kinds of the complex structure 1 including the number of the terminal pins 3. The reference number 25 designates a control unit forming part of the molding means 20 and having data inputting means for inputting data indicative of the kinds of the complex structure 1 including the number of the terminal pins 3 to the control unit 25 of the molding means 20. The data inputting means may be replaced by a microcomputer operable to input the data indicative of the kinds of the complex structure 1 to the controlling means. The control unit 25 of the molding means 20 functions as specifying means for specifying the kind of the complex structure 1 in accordance with the data memorized in the memorizing means and the data inputted by the data inputting means to determine the number of terminal pins in the complex structure and the lengths L of the segmented metal materials 13 and 14 in the second direction.

The operation of the complex structure molding apparatus will be described hereinlater.

The memorizing means is previously operated to memorize the data representing the kinds of the complex structures 1 and indicative of the number of terminal pins 3 and the lengths L of the segmented metal materials 13 and 14 in the second direction. The data representing the kinds of the complex structures 1 may be produced and transmitted to the controlling means by the microcomputer forming the data inputting means.

On the other hand, the continuous metal materials 11 and 12 are previously stored by the metal material storing means 30 and then unwound to have the leading end portions of the continuous metal materials 11 and 12 reach to the stationary cutter blade 41 of first metal material cutting means 40.

The data inputting means is then manipulated to input the data indicative of the kind of the complex structure 1 to the controlling means. At this time, the controlling means is operated to specify the kind of the complex structure 1 in accordance with the data memorized in the memorizing means and the data inputted by the data inputting means to determine the number of terminal pins 3 in the complex structure 1 and the length L of the segmented metal materials 13 and 14 in the second direction.

The controlling means is then operated to control the operational conditions of the molding means 20, the metal materials storing means 30, the first metal material cutting means 40, the metal material setting means 50, the metal material feeding means 60 and the second metal material cutting means 70 to carry out the molding process comprising the following steps.

The plastic base 2 is molded at the molding step to have the terminal pins 3 partly embedded in the plastic base 2.

The continuous metal materials 11 and 12 are cut at the first material cutting step by the first metal material cutting means 40 in a first direction parallel to the direction in which the terminal pins 3 extend from the rim portion 11a and 12a before the segmented metal materials 13 and 14 are fed to the molding means 20 to be partly molded with the plastic.

The segmented metal materials 13 and 14 are then arranged at the segmented material arranging step by the metal material arranging means 90 to be spaced in spaced relationship with one another in the second direction before the segmented metal materials 13 and 14 are set by the metal material setting means 50 in the molding means 20 under the state that the segmented metal materials 13 and 14 are set in the first direction in spaced relationship with one another.

The segmented metal materials 13 and 14 are then set at their respective predetermined positions in the molding means 20 in the state having the segmented metal materials 13 and 14 assume their predetermined attitudes.

In the above steps, the continuous metal materials 11 and 12 are fed to the first metal material cutting mean 40 to be cut and divided into the segmented metal materials 13 and 14.

The movable metal mold 23 is then downwardly moved at the insert molding step to close the cavities 22a of the stationary metal mold 22 and to allow the cavities 22a to be filled with the molten plastic material by the extruder 21 under the state that the segmented metal materials 13 and 14 are partly placed in the cavities 22a of the stationary metal mold 22. The segmented metal materials 13 and 14 are partly embedded in the plastic in the cavities 22a and a plurality of composites each including the segmented metal materials 13 and 14 and the plastic base 2 is produced.

The segmented metal materials 13 and 14 of the molded composite 15 are then cut at the second material cutting step in a second direction perpendicular to the first direction to remove the rim portion 13a and 14a from the terminal pins 13b and 14b and the plastic base 2.

According to the above mentioned complex structure molding apparatus, the leading end portion of the continuous metal materials 11 and 12 are cut to form the segmented metal materials 13 and 14 each having a predetermined length L varied with the number of the terminal pins 3 of the complex structure 1 to be molded by the molding apparatus. The lengths L of the segmented metal materials 13 and 14 are determined based on the sizes of the complex structures 1 so that the segmented metal materials 13 and 14 are equally spaced apart from one another in the second direction parallel to the longitudinal direction of the segmented metal materials 13 and 14 and that the stationary and movable metal molds 22 and 23 contact with each other between the segmented metal materials 13 and 14 without cutting any pin portions 13c and 14c. Consequently, the complex structure molding apparatus according to the present invention can reduce the production cost of the final complex structure. In other words, the complex structures molded by the molding apparatus according to the present invention can be less costly by the reason that the plated costly pin portions of the continuous metal materials are used for the complex structure without any scraps of the pin portions.

Additionally, the data indicative of the number of terminal pins 3 in the complex structure 1 and the lengths L of the segmented metal materials 13 and 14 are memorized by the memorizing means associated with the controlling means, thereby making it possible to promptly and readily change the operation condition of the complex structure molding apparatus based on the data memorized in the memorizing means and the data inputted by the data inputting means when the kind of the complex structures or the kind of the metal mold structure is changed.

It will be understood by those skilled in the art that the foregoing description is in terms of preferred embodiments of the present invention wherein various changes and modifications may be made without departing from the spirit and scope of the invention, as set forth in the appended claims.

What is claimed is:

1. A complex structure molding process for molding a complex structure including a plastic base and a plurality of terminal pins having an inner portion embedded in said plastic base and an outer portion extending outwardly of the plastic base, comprising the steps of:

molding said plastic base to have said terminal pins partly embedded in said plastic base;

storing a continuous metal material having a rim portion and a plurality of terminals pins perpendicularly extending from said rim portion and equally spaced apart from one another along the longitudinal direction of said rim portion;

cutting said continuous metal material in a first direction parallel to the direction in which said terminal pins extend from said rim portion to form a plurality of segmented metal materials before said segmented metal materials are partly molded with said plastic;

setting said segmented metal materials in the state having said segmented metal materials assume their predetermined attitudes;

feeding said continuous metal material to cut said continuous metal materials and to set said segmented metal materials for molding to said plastic base to have said terminal pins partly embedded in said plastic base; and cutting said molded segmented metal materials in a second direction perpendicular to said first direction to remove said rim portion from said terminal pins and said plastic base.

2. A complex structure molding process as set forth in claim 1, which further comprises the step of arranging said segmented metal materials in said second direction in spaced relationship with one another.

3. A complex structure molding process for molding a complex structure including a plastic base and a plurality of terminal pins having a pair of inner portions each embedded in said plastic base and a pair of outer portions each extending outwardly of the plastic base, comprising the steps of:

molding said plastic base to have said terminal pins partly embedded in said plastic base;

storing a pair of continuous metal materials arranged in face-to-face relationship with each other and each having a rim portion and a plurality of terminal pins perpendicularly extending from said rim portions and equally spaced apart from one another along the longitudinal direction of said rim portion;

cutting said continuous metal materials in a first direction parallel to the direction in which said terminal pins respectively extend from sid rim portions to form pairs of segmented metal materials before said segmented metal materials are partly molded with said plastic;

setting said segmented metal materials in the state having said segmented metal materials assume their predetermined attitudes;

feeding said continuous metal materials to cut said continuous metal materials and to set said segmented metal materials for molding to said plastic base to have said terminal pins partly embedded in said plastic base; and cutting said molded segmented metal materials in a second direction perpendicular to said first direction to remove said rim portions from said terminal pins and said plastic base.

4. A complex structure molding process as set forth in claim 3, which further comprises the step of arranging said pairs of segmented metal materials in said second direction in spaced relationship with one another.

5. A complex structure molding apparatus for molding a complex structure including a plastic base and a plurality of terminal pins having an inner portion embedded in said plastic base and an outer portion extending outwardly of the plastic base, comprising:

molding means for molding said plastic base to have said terminal pins partly embedded in said plastic base;

metal material storing means for storing a continuous metal material having a rim portion and a plurality of terminal pins perpendicularly extending from said rim portion and equally spaced apart from one another along the longitudinal direction of said rim portion;

first metal material cutting means for cutting said continuous metal material in a first direction parallel to the direction in which said terminal pins extend from said rim portion to form a plurality of segmented metal materials which are to be fed to said molding means to partly be molded with said plastic;

metal material setting means for setting said segmented metal material in said molding means in the state having said segmented metal material assume their predetermined attitudes;

metal material feeding means for feeding said metal material to said material cutting means and said metal material setting means from said material storing means; and second material cutting means for cutting said molded segmented metal materials in a second direction perpendicular to said first direction, to remove said rim portion from said terminal pins and said plastic base.

6. A complex structure molding apparatus as set forth in claim 5, which further comprises metal material arranging means for arranging said segmented metal materials in said second direction in spaced relationship with one another before sad segmented metal materials are set by said metal material setting means in said molding means under the state that said segmented metal materials are set in said first direction in spaced relationship with one another.

7. A complex structure molding apparatus as set forth in claim 5, in which said first metal material cutting means comprises a stationary cutter blade extending in said first direction, and a movable cutter blade movable toward and away from a cutting position where said stationary cutter blade and said movable cutter blade cooperate with each other to cut said continuous metal material in said first direction.

8. A complex structure molding apparatus as set forth in claim 7, in which said first metal material cutting means further comprises a first movable clamp positioned above said stationary cutter blade and movable toward away from a clamping position where said continuous metal material is clamped in cooperation with said stationary cutter blade, and a second movable clamp positioned below said movable cutter blade and movable toward away from a clamping position where said continuous metal material is clamped in cooperation with said movable cutter blade.

9. A complex structure molding apparatus as set forth in claim 6, in which said first and second movable clamps are resiliently urged by first and second resilient means to a stationary member forming part of said molding means.

10. A complex structure molding apparatus as set forth in claim 5, which further comprises:

controlling means for controlling the operational conditions of said molding means, said metal material storing means, said first metal material cutting means, said metal material setting means, said metal material feeding means, and said second material cutting means;

memorizing means for memorizing data indicative of the number of terminal pins in said complex structure and the lengths of said segmented metal materials in the second direction in accordance with the kinds of the complex structure including the number of said terminal pins;

data inputting means for inputting data indicative of the kinds of the complex structure including the number of said terminal pins to said controlling means; and specifying means for specifying the kind of said complex structure in accordance with said data memorized in said memorizing means and said data inputted by said data inputting means to determine the number of terminal pins in said complex structure and the lengths of said segmented metal materials in the second direction.

11. A complex structure molding apparatus for molding a complex structure including a plastic base and a plurality of terminal pins having a pair of inner portions each embedded in said plastic base and a pair of outer portions each extending outwardly of the plastic base, comprising:

molding means for molding said plastic base to have said terminal pins partly embedded in said plastic base;

metal material storing means for storing a pair of continuous metal materials arranged in face-to-face relationship with each other and each having a rim portion and a plurality of terminal pins perpendicularly extending from said rim portion and equally spaced apart from one another along the longitudinal direction of said rim portion;

first metal material cutting means for cutting said continuous metal materials in a first direction parallel to the direction in which said terminal pins respectively extend from said rim portions to form pairs of segmented metal materials which are to be fed to said molding means to partly be molded with said plastic;

metal material setting means for setting said segmented metal materials in said molding means in the state having said segmented metal material assume their predetermined attitudes;

metal material feeding means for feeding said metal materials to said material cutting means and said metal material setting means from said material storing means; and second material cutting means for cutting said molded segmented metal materials in a second direction perpendicular to said first direction to remove said rim portions from said terminal pins and said plastic base.

12. A complex structure molding apparatus as set forth in claim 11, which further comprises metal material arranging means for arranging said pairs of segmented metal materials in said second direction in spaced relationship with one another before said segmented metal materials are respectively set by said metal material setting means in said molding means under the state that said segmented metal materials are set in said first direction in spaced and face-to-face relationship with one another.

13. A complex structure molding apparatus as set forth in claim 11, in which said first metal material cutting means comprises a stationary cutter blade extending in said first direction, and a movable cutter blade movable toward and away from a cutting position where said stationary cutter blade and said movable cutter blade cooperate with each other to cut said continuous metal materials in said first direction.

14. A complex structure molding apparatus as set forth in claim 13, in which said first metal material cutting means further comprises a first movable clamp positioned above said stationary cutter blade and movable toward away from a clamping position where said continuous metal materials are clamped in cooperation with said stationary cutter blade, and a second movable clamp positioned below said movable cutter blade and movable toward away from a clamping position where said continuous metal materials are clamped in cooperation with said movable cutter blade.

15. A complex structure molding apparatus as set forth in claim 14, in which said first and second movable clamps are resiliently urged by first and second resilient means to a stationary member forming part of said molding means.

16. A complex structure molding apparatus as set forth in claim 11, which further comprises:

controlling means for controlling the operational conditions of said molding means, said metal material storing means, said first metal material cutting means, said metal material setting means, said metal material feeding means, and said second material cutting means;

memorizing means for memorizing data indicative of the number of terminal pins in said complex structure and the lengths of said segmented metal materials in the second direction in accordance with the kinds of the complex structure including the number of said terminal pins;

data inputting means for inputting data indicative of the kinds of the complex structure including the number of said terminal pins to said controlling means; and specifying means for specifying the kind of said complex structure in accordance with said data memorized in said memorizing means and said data inputted by said data inputting means to determine the number of terminal pins in said complex structure and the lengths of said segmented metal materials in the second direction.

* * * * *